(12) United States Patent
Sumitani et al.

(10) Patent No.: US 7,580,305 B2
(45) Date of Patent: Aug. 25, 2009

(54) SEMICONDUCTOR MEMORY

(75) Inventors: Norihiko Sumitani, Osaka (JP); Hidenari Kanehara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/078,743

(22) Filed: Apr. 4, 2008

(65) Prior Publication Data
US 2008/0259706 A1  Oct. 23, 2008

Related U.S. Application Data

(62) Division of application No. 11/449,606, filed on Jun. 9, 2006, now Pat. No. 7,366,037.

(30) Foreign Application Priority Data

Jun. 9, 2005  (JP)  ............................. 2005-169201

(51) Int. Cl.
  *G11C 7/00*  (2006.01)
(52) U.S. Cl. ...................... 365/203; 365/154; 365/210.1
(58) Field of Classification Search ............. 365/210.11
See application file for complete search history.

(56) References Cited

U.S. PATENT DOCUMENTS

| | | | |
|---|---|---|---|
| 4,811,300 A | 3/1989 | Lanfranca | |
| 4,894,803 A | 1/1990 | Aizaki | |
| 4,935,896 A | 6/1990 | Matsumura et al. | |
| 4,984,201 A | 1/1991 | Sato et al. | |
| 5,010,519 A | 4/1991 | Yoshimoto et al. | |
| 5,369,612 A | 11/1994 | Furuyama | |
| 5,745,421 A | 4/1998 | Pham et al. | |
| 5,748,536 A | 5/1998 | Kwon et al. | |
| 5,768,215 A | 6/1998 | Kwon et al. | |
| 5,880,990 A | 3/1999 | Miura | |
| 6,055,188 A | 4/2000 | Takeuchi et al. | |
| 6,185,140 B1 | 2/2001 | Agrawal | |
| 6,236,588 B1 * | 5/2001 | Koo | ........................... 365/145 |
| 6,438,035 B2 | 8/2002 | Yamamoto et al. | |

(Continued)

FOREIGN PATENT DOCUMENTS

JP  7-153272 A  6/1995

OTHER PUBLICATIONS

Osamu Minato, et al., "THPM 15.5: A 2Ons 64K CMOS SRAM," IEEE International Solid-State Circuits Conference, Feb. 23, 1984, pp. 222-223, Session XV: Static RAMs, IEEE.

*Primary Examiner*—Tan T. Nguyen
(74) *Attorney, Agent, or Firm*—McDermott Will & Emery LLP

(57) ABSTRACT

A semiconductor memory includes: first and second bit lines; a precharge circuit for precharging the first and second bit lines to a predetermined potential; a plurality of memory cells each connected to the first or second bit line, a selected one of the memory cells maintaining or discharging one of the precharged first and second bit lines according to a signal held by the selected memory cell; word lines for selecting the memory cells; first and second reference cells connected to the first and second bit lines, respectively, a selected one of the first and second reference cells discharging the first or second bit line connected to the selected reference cell; and first and second reference cell word lines for selecting the first and second reference cells, respectively.

12 Claims, 7 Drawing Sheets

U.S. PATENT DOCUMENTS 7,099,213 B2 8/2006 Ju
7,145,792 B2 * 12/2006 Hokari et al. .............. 365/149
2002/0071317 A1 * 6/2002 Bohm et al. ........... 365/189.07
2004/0017704 A1 * 1/2004 Yamaoka et al. ............ 365/200
2005/0125591 A1 6/2005 Fujimoto
2006/0077740 A1 * 4/2006 Lee et al. .................... 365/210

* cited by examiner

SEMICONDUCTOR MEMORY

RELATED APPLICATIONS

This application is a Divisional of U.S. application Ser. No. 11/449,606, filed Jun. 9, 2006 now U.S. Pat. No. 7,366,037, claiming priority of Japanese Application No. 2005-169201, filed Jun. 9, 2005, the entire contents of each of which are hereby incorporated by reference.

BACKGROUND OF THE INVENTION

1. Field of the Invention

The present invention relates to a so-called single bit line semiconductor memory wherein a bit line is precharged to a predetermined potential and then discharged according to memory data, whereby reading of the data is accomplished.

2. Description of the Prior Art

The single bit line semiconductor memory performs reading of data by precharging a bit line to a predetermined potential and then discharging the bit line according to memory data (for example, U.S. Pat. No. 5,880,990). A semiconductor memory of this type includes a sense amplifier SA which has an inverter INVSA1 and a PMOS transistor PTSA1 as shown in FIG. 4 of the publication of this patent. When reading data which is supposed to be read such that output data DATA is at L (Low) level, the PMOS transistor PTSA1 maintains the bit lint potential at H (High) level.

However, in the semiconductor memory having the PMOS transistor PTSA1 as described above, when reading data which is supposed to be read such that the bit line potential transitions to L level, the bit line potential is prevented from decreasing because the PMOS transistor PTSA1 serves to maintain the bit line potential at H level at the time of precharging the bit line. This deteriorates the reading speed. This problem is especially critical when the supply voltage is decreased.

SUMMARY OF THE INVENTION

In view of the above circumstances, an objective of the present invention is to increase the speed of a reading operation without causing any error in read data.

To achieve the above objective, there is provided a semiconductor memory according to an embodiment of the present invention, comprising:

first and second bit lines;

a precharge circuit for precharging the first and second bit lines to a predetermined potential;

a plurality of memory cells each connected to the first or second bit line, a selected one of the memory cells maintaining or discharging one of the precharged first and second bit lines according to a signal held by the selected memory cell;

word lines for selecting the memory cells;

first and second reference cells connected to the first and second bit lines, respectively, a selected one of the first and second reference cells discharging the first or second bit line connected to the selected reference cell; and first and second reference cell word lines for selecting the first and second reference cells, respectively.

With the above structure, the timings of the various operations, such as a precharge operation, a reading operation, etc., can be appropriately controlled according to the decrease of the bit line potential due to discharging of the reference cell. Particularly, the precharge operation and the reading operation are carried out for predetermined time intervals based on the above-described timing control function. Therefore, the decrease of the bit line potential according to memory data can be quickly achieved to perform a high speed reading operation, and an error which would be caused by a decrease in bit line potential due to a leak current, or the like, can readily be prevented.

There is also provided a semiconductor memory, comprising:

a bit line;

a precharge circuit for precharging the bit line to a predetermined potential;

a plurality of memory cells connected the bit line, a selected one of the memory cells maintaining or discharging the precharged bit line according to a signal held by the selected memory cell;

word lines for selecting the memory cells; and a latch circuit for holding a signal according to the potential of the bit line a predetermined time interval after the precharging of the bit line is stopped and the memory cell is selected.

With the above structure also, the decrease of the bit line potential according to memory data can be quickly achieved to perform a high speed reading operation, and an error which would be caused by a decrease in bit line potential due to a leak current, or the like, can readily be prevented.

DESCRIPTION OF THE PREFERRED EMBODIMENTS

Figure 1:
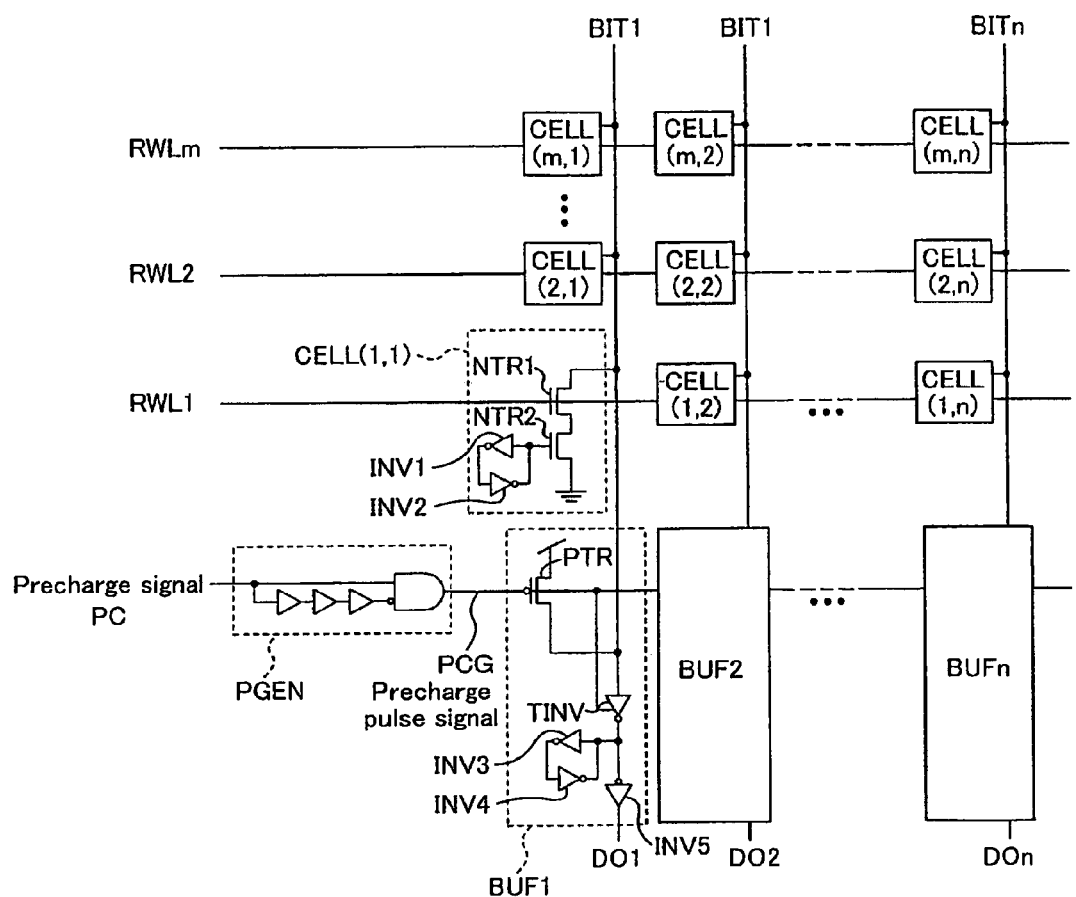
FIG. 1 is a circuit diagram showing a structure of a semiconductor integrated circuit according to embodiment 1.

Hereinafter, embodiments of the present invention will be described in detail with reference to the drawings. In the embodiments described below, like elements are denoted by like reference numerals, and descriptions thereof are not repeatedly provided.

Embodiment 1

FIG. 1 is a circuit diagram showing a structure of a semiconductor integrated circuit according to embodiment 1. It should be noted that in FIG. 1 part of the circuit relevant to a writing function is omitted.

In FIG. 1, memory cells CELL (1,1) to CELL (m,n) are in a matrix configuration of m rows by n columns. Specifically, each of the memory cells is formed by two inverters INV1 and INV2 and two N-channel transistors NTR1 and NTR2. When a word line (described later) transitions to H (High) level, the charges of each bit line are maintained or discharged according to a signal latched by the inverters INV1 and INV2.

Reference numerals BIT1 to BITn denote bit lines.

Reference numerals RWL1 to RWLm denote word lines, any one of which transitions to H level according to an address signal (not shown) designated by a device external to the semiconductor memory.

Reference numeral PGEN denotes a pulse signal generation circuit which outputs precharge pulse signal PCG according to precharge signal PC. Precharge pulse signal PCG is at H level for a predetermined time period independent of the clock frequency (read cycle time).

Reference numerals BUF1 to BUFn denote output circuits for outputting read data signal DO1 to DOn, respectively, according to the potentials of the bit lines BIT1 to BITn which are determined based on the memory data of the memory cells CELL (1,1) to CELL (m,n). Specifically, each of the output circuits BUF1 to BUFn is formed by a precharge transistor PTR, a tri-state inverter TINV, and three inverters INV3 to INV5. The precharge transistor PTR precharges the bit lines BIT1 to BITn when precharge pulse signal PCG is at L (Low) level. The tri-state inverter TINV causes the inverters INV3 and INV4 to hold a signal which is determined according to the potential of a corresponding one of the bit lines BIT1 to BITn immediately before precharge pulse signal PCG transitions from H level to L level. Meanwhile, the tri-state inverter TINV causes the inverter INV5 to output a read data signal (DO1 to DOn).

Figure 2:
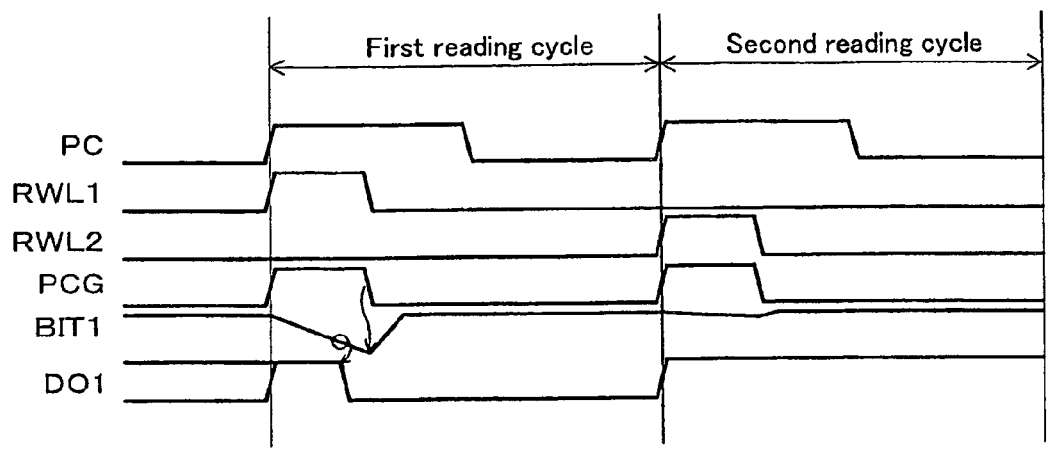
FIG. 2 is a timing chart illustrating a reading operation of the semiconductor integrated circuit according to embodiment 1.

A reading operation of the semiconductor memory having the above-described structure is described with reference to the timing chart shown in FIG. 2. In an example described herein, memory data of the memory cells CELL(1,1) to CELL(1,n) connected to the word line RWL1 are read in the first reading cycle, and then, memory data of the memory cells CELL(2,1) to CELL(2,n) connected to the word line RWL2 are read in the second reading cycle. The memory cell CELL(1,1) stores a signal which is supposed to be read such that the charges of the bit line BIT1 are discharged (for example, data "0"). The memory cell CELL(2,1) stores a signal which is supposed to be read such that the charges of the bit line BIT2 are maintained (for example, data "1").

(Before First Reading Cycle)

When precharge signal PC is pulled to L level, the potential of the bit line BIT1 is precharged to the supply voltage by the precharge transistor PTR of the output circuit BUF1.

(First Reading Cycle)

After the start of the first reading cycle where precharge signal PC transitions to H level, precharge pulse signal PCG is at H level for a predetermined time period, during which a precharge operation is interrupted. At the same time, i.e., at the start of the first cycle, the word line RWL1 selected according to the address signal is activated so that, for example, read data signal DO1 is temporarily at H level. However, the charges of the bit line BIT1 are discharged through the N-channel transistors NTR1 and NTR2 of the memory cell CELL(1,1), and then, the potential of the bit line BIT1 decreases to a predetermined level, so that read data signal DO1 falls to L level.

Then, after the passage of a predetermined H-level period, precharge pulse signal PCG returns to L level. Accordingly, the output of the tri-state inverter TINV enters a high impedance state, while the immediately-previous state of the tri-state inverter TINV is held by the inverters INV3 and INV4, so that read data signal DO1 is maintained at L level.

Meanwhile, the return of precharge pulse signal PCG to L level turns the precharge transistor PTR ON, so that the bit line BIT1 and other bit lines are precharged for the next reading cycle.

(Second Reading Cycle)

At the start of the second reading cycle, precharge signal PC transitions to H level so that the precharge operation is interrupted as in the first reading cycle. When the word line RWL2 is activated, read data signal DO1 transitions to H level. Since the N-channel transistor NTR2 is OFF when data "1" is stored in the memory cell CELL(2,1), the charges of the bit line BIT1 are not discharged (although, precisely, it is discharged in consideration of a leak current), so that read data signal DO1 stays at H level.

Then, after the passage of a predetermined H-level period, precharge pulse signal PCG returns to L level. Accordingly, the output of the tri-state inverter TINV enters a high impedance state, while the immediately-previous state of the tri-state inverter TINV is held by the inverters INV3 and INV4, so that read data signal DO1 is maintained at H level.

As described above, the precharge operation is interrupted for a predetermined time period independent of the clock frequency such that supply of the charges to a bit line is stopped. Therefore, the discharge operation is quickly carried out according to memory data, while an error which would be caused by a leak current is prevented (even without a keeper circuit that maintains the charges of the bit line). Thus, even when the supply voltage is set to a low voltage, the speed of the reading operation can be readily increased and, at the same time, occurrence of an error is prevented. Especially in a single bit line semiconductor memory which has a relatively small number of memory cells connected to bit lines and having relatively high threshold voltage, a variation in potential of the bit line due to a leak current which is generated when reading data which is supposed to be read such that the bit line transitions to H level is small, and therefore, the increase in the data reading speed and the prevention of an error are achieved more readily.

Embodiment 2

An example of a semiconductor memory is described wherein the period of interruption of the precharge operation and the period of the operation of reading memory data are controlled more appropriately. In this semiconductor memory, the charges of a bit line are discharged by a reference cell which has a similar structure to that of the memory cell, and the period of the reading operation is controlled according to the timing of this decrease of the bit line potential.

Figure 3:
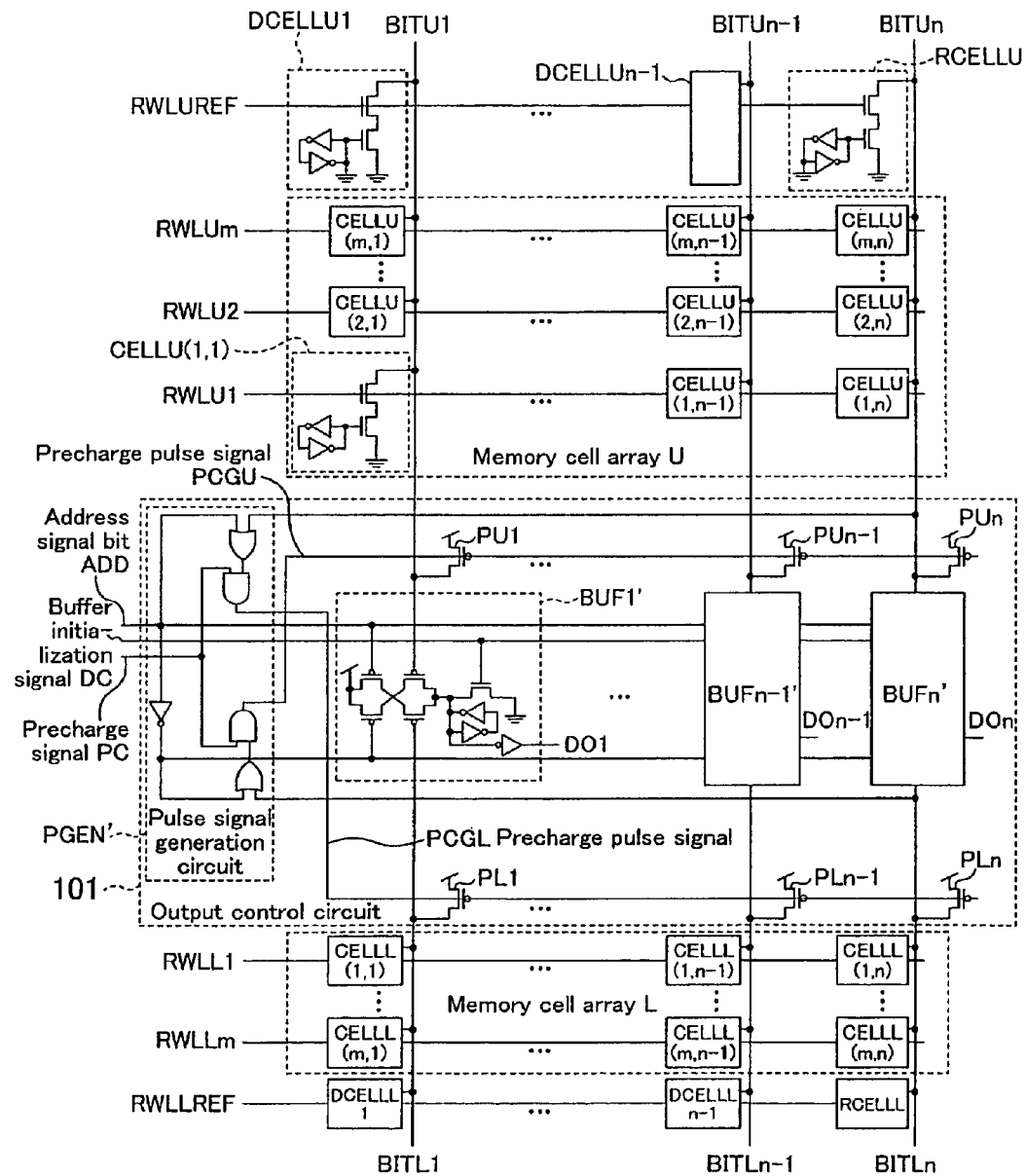
FIG. 3 is a circuit diagram showing a structure of a semiconductor integrated circuit according to embodiment 2.

FIG. 3 is a circuit diagram showing a structure of a semiconductor integrated circuit according to embodiment 2.

This semiconductor memory has two memory cell arrays (memory cell arrays U and L) which have the same structure as that of embodiment 1. The memory cell array U includes memory cells CELLU(1,1) to CELLU(m,n), bit lines BITU1 to BITUn, and word lines RWLU1 to RWLUm. The memory cell array L includes memory cells CELLL(1,1) to CELLL(m,n), bit lines BITL1 to BITLn, and word lines RWLL1 to RWLLm.

An output control circuit 101 (described later in detail) is further provided in place of the output circuits BUF1 to BUFn and the pulse signal generation circuit PGEN.

In the memory cell array U, one of the bit lines BITU1 to BITUn (herein, bit line BITUn) is connected to a reference cell RCELLU. The other bit lines are connected to dummy cells DCELLU1 to DCELLUn-1. The reference cell RCELLU and dummy cells DCELLU1 to DCELLUn-1 are selected by a reference word line RWLUREF.

In the memory cell array L, one of the bit lines BITL1 to BITLn (herein, bit line BITLn) is connected to a reference cell RCELLL. The other bit lines are connected to dummy cells DCELLL1 to DCELLLn-1. The reference cell RCELLL and dummy cells DCELLL1 to DCELLLn-1 are selected by a reference word line RWLLREF.

The reference cells RCELLU and RCELLL have a structure similar to that of the other normal memory cells. However, when selected by the reference word lines RWLUREF and RWLLREF, the reference cells RCELLU and RCELLL always discharge the charges of the bit lines BITUn and BITLn (although the discharge currents are set slightly smaller than those of the other normal memory cells). The dummy cells are provided such that the state of the reference word lines RWLUREF and RWLLREF which drive cells is equal to the state of the other normal word lines which drive memory cells. The dummy cell DCELLU1 is, for example, always in a state where the charges of the bit line BITU1 are not discharged therethrough.

Now, consider a case where the memory cell array U is selected for reading data therefrom. When any one of the word lines RWLU1 to RWLUm of the memory cell array U is activated, the reference word line RWLLREF of the memory cell array L is activated at the same time (at this time, none of the reference word line RWLUREF of the memory cell array U and the word lines RWLL1 to RWLLm of the memory cell array L is activated). Likewise, when any one of the word lines RWLL1 to RWLLm of the memory cell array L is activated, the reference word line RWLUREF of the memory cell array U is also activated at the same time (none of the reference word line RWLLREF of the memory cell array L and the word lines RWLU1 to RWLUm of the memory cell array U is activated).

The method for making the discharge currents of the reference cells RCELLU and RCELLL (slightly) smaller than that of the normal memory cell is not limited to any particular method, but may be as described below.

For example, when the reference cells and memory cells are designed such that in each cell the charges of a bit line are discharged through its N-channel MOS transistor, the N-channel MOS transistors of the reference cells may have a smaller gate width, a greater gate length, a higher threshold voltage, or a lower substrate potential as compared with the N-channel MOS transistors of the memory cells. Alternatively, the N-channel MOS transistor may have a high source potential (i.e., the difference in potential may be small between a bit line which is to be discharged and an element to which the discharged charges are to be sent at the start of the discharge process). Still alternatively, the supply voltage which is to be supplied to an inverter that keeps the N-channel MOS transistor ON (specifically, a P-channel MOS transistor of the inverter) may be low. Furthermore, these arrangements may be used in various combinations. Even if MOS transistors of other channels or MIS transistors of other types are used, the above arrangements may be effectively employed.

The output control circuit 101 includes precharge transistors PU1 to PUn and PL1 to PLn, a pulse signal generation circuit PGEN', and output circuits BUF1' to BUFn'.

Each of the precharge transistors PU1 to PUn and PL1 to PLn has the same structure as that of the precharge transistor PTR of embodiment 1.

When reading data from one of the memory cell arrays, the pulse signal generation circuit PGEN' controls the period of interruption of the precharge operation and the period of the reading operation according to the potential of a bit line to which the reference cell of the other memory cell array is connected. More specifically, for example, in the case where address signal bit ADD (e.g., the most significant bit of an address signal) transitions to H level, whereby the memory cell array U is selected, so that precharge signal PC transitions to H level, the pulse signal generation circuit PGEN' pulls precharge pulse signal PCGU to H level to stop the precharge operation of the precharge transistors PU1 to PUn for the bit lines BITU1 to BITUn for starting a reading operation. Then, when the potential of the bit line BITLn of the unselected memory cell array L decreases to L level due to the discharge of the reference cell RCELLL, the pulse signal generation circuit PGEN' pulls precharge pulse signal PCGU to L level to start the next precharge operation cycle while stopping the reading operation. In the case where the memory cell array L is selected for reading data therefrom, the precharge operation and reading operation of the bit lines BITL1 to BITLn are likewise controlled according to the decrease in potential of the bit line BITUn of the memory cell array U.

The output circuits BUF1' to BUFn' (the detailed structure of the output circuit BUF1' is shown in FIG. 3) are initialized when buffer initialization signal DC transitions to H level (more specifically, a latch circuit inside each output buffer is initialized) so that read data signal DO1 transitions to H level. Thereafter, when the potential of the bit line BITU1 or BITL1 selected according to address signal bit ADD transitions to L level based on memory data, read data signal DO1 switches to L level.

The memory cell arrays U and L preferably have the same or symmetric arrangement patterns over the semiconductor integrated circuit. The reference cell RCELLU is preferably more distant from the output circuit BUFn' than the memory cells CELLU are. The semiconductor memory may have three or more memory cell arrays so long as the timing of the precharge operation, and the like, is controlled by a reference cell of a memory cell array other than one in which a reading operation is carried out.

Figure 4:
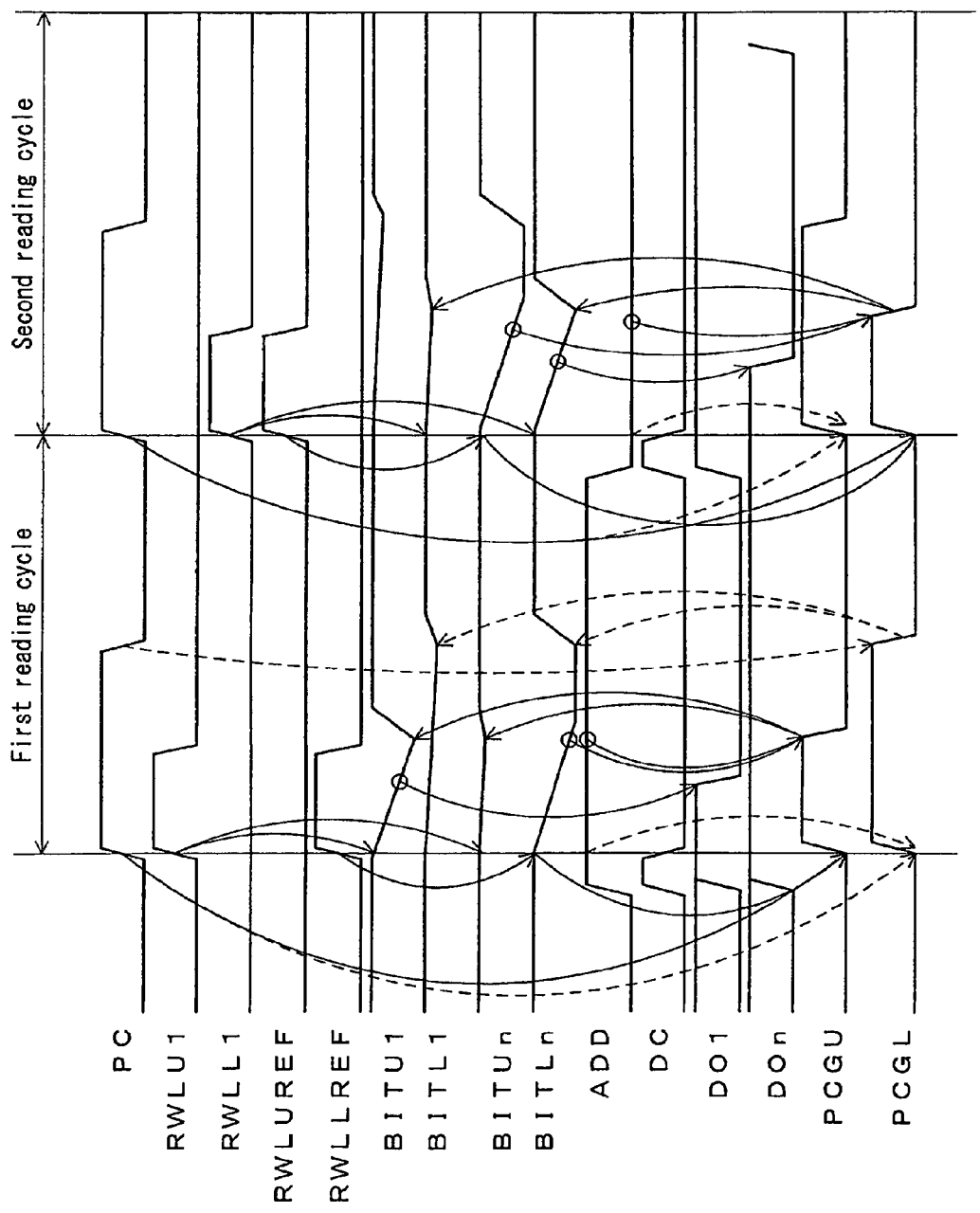
FIG. 4 is a timing chart illustrating a reading operation of the semiconductor integrated circuit according to embodiment 2.

A reading operation of the semiconductor memory having the above-described structure is described with reference to the timing chart shown in FIG. 4.

Herein, the reading operation is described based on an example where memory data of the memory cells CLLLU(1,1) to CELLU(1,n) of the memory cell array U are read out in the first reading cycle, and then, memory data of the memory cells CELLL(1,1) to CELLL(1,n) of the memory cell array L are read out in the second reading cycle.

It is assumed herein that the memory data of the memory cell CELLU(1,1) is "0", the memory data of the memory cell CELLU(1,n) is "1", the memory data of the memory cell CELLL(1,1) is "1", and the memory data of the memory cell CELLL(1,n) is "0".

(Before First Reading Cycle)

Precharge signal PC is at L level, so that the potentials of all the bit lines of the memory cell arrays U and L are precharged to the supply potential by the precharge transistors.

Buffer initialization signal DC is temporarily pulled to H level, whereby all the output circuits BUF1' to BUFn' are initialized such that all read data signals DO1 transition to H level.

(First Reading Cycle)

When precharge signal PC-transitions to H level while the bit line BITLn is at H level due to the above-described precharge operation (as are the other bit lines), precharge pulse signal PCGU transitions to H level.

When reading memory data from the memory cell array U, address signal bit ADD transitions to H level, while the bit line BITUn is at H level due to the above-described precharge operation (as are the other bit lines). Therefore, if in these circumstances precharge signal PC transitions to H level, precharge pulse signal PCGL also transitions to H level. Accordingly, all the precharge transistors are turned OFF so that the precharge operation is interrupted.

When the word line RWLU1 is pulled to H level for reading information stored in the memory cells CELLU(1,1) to CELLU(1,n), the charges accumulated in bit lines connected to memory cells in which "0" is stored (for example, the bit line BITU1 connected to the memory cell CELLU(1,1)) are started to be discharged. Meanwhile, bit lines connected to memory cells in which "1" is stored (for example, the bit line BITUn connected to the memory cell CELLU(1,n) in which data "1" is stored) are not discharged. On the other hand, in the memory cell array L from which data is not read at this time, the reference word line RWLLREF is pulled to H level, so that the bit line BITLn is started to be discharged by the reference cell RCELLL.

Since the discharge operation is carried out during the interruption of the precharge operation as described above, the potential of a bit line connected to a memory cell in which data "1" is stored (e.g., bit line BITU1) quickly decreases. Meanwhile, the potential of a bit line connected to a memory cell in which data "0" is stored (e.g., bit line BITUn) decreases only slightly by a leak current. Thereafter, the potential of the bit line connected to the memory cell storing data "1" (e.g., bit line BITU1) reaches L level so that the read data signal (e.g., DO1) falls to L level. Then, the bit line BITLn transitions to L level due to the discharging of the reference cell RCELLL, so that precharge pulse signal PCGU transitions to L level, whereby the next precharge operation cycle is started. Therefore, even in the case where data "0" is stored, an error which would be caused by a decrease in bit line potential due to a leak current is prevented. That is, if the bit line (e.g., bit line BITU1) reaches L level before precharge pulse signal PCGU falls to L level, read data signal DO1 transitions to L level. If the bit line (e.g., bit line BITU1) does not reach L level before precharge pulse signal PCGU falls to L level, read data signal DOn is maintained at H level. As a result, the level of read data signal DO1 is determined according to the memory data of the memory cell array U, whereby the reading operation of the memory cell array U is completed.

At the end of the first reading cycle where the bit lines of the memory cell array U have already been in a precharge period, precharge signal PC transitions to H level so that the bit lines of the memory cell array L are also precharged. Then, buffer initialization signal DC is again pulled to H level, whereby all the read data signals (DO1 . . . ) are initialized to H level.

(Second Reading Cycle)

At the start of the second reading cycle, as in the first reading cycle, precharge signal PC transitions to H level while address signal bit ADD is at L level for reading memory data from the memory cell array L. Accordingly, precharge pulse signals PCGU and PCGL transition to H level, whereby the precharge operation is interrupted.

When the word line RWLL1 is pulled to H level, bit lines connected to memory cells in which "1" is stored (for example, the bit line BITL1 connected to the memory cell CELLL(1,1)) are not discharged. Meanwhile, bit lines connected to memory cells in which "0" is stored (for example, the bit line BITLn connected to the memory cell CELLL(1,n)) are started to be discharged. On the other hand, in the memory cell array U from which data is not read at this time, the reference word line RWLUREF is pulled to H level, so that the bit line BITUn is started to be discharged by the reference cell RCELLU.

Thereafter, the potential of the bit line (e.g., bit line BITLn) reaches L level so that the read data signal (e.g., DOn) falls to L level. Then, the bit line BITUn transitions to L level due to the discharging of the reference cell RCELLU, so that precharge pulse signal PCGL transitions to L level, whereby the next precharge operation cycle is started, and the reading operation of the memory cell array L is completed.

As described above, the timing of the reading operation is controlled with high accuracy based on the discharging of the reference cells which have the current driving capacity (discharge capacity) equal to or substantially equal to that of the memory cells. Therefore, the precharge operation can readily be interrupted for a least necessary interval. The discharge operation is quickly carried out in a more secure manner according to memory data while an error which would be caused due to a leak current is prevented. As a result, the speed of the reading operation can readily be further improved.

Embodiment 3

Now, an example of a semiconductor memory is described wherein the interval of interruption of the precharge operation and the period of the reading operation of memory data are controlled in a more appropriate manner.

Figure 5:
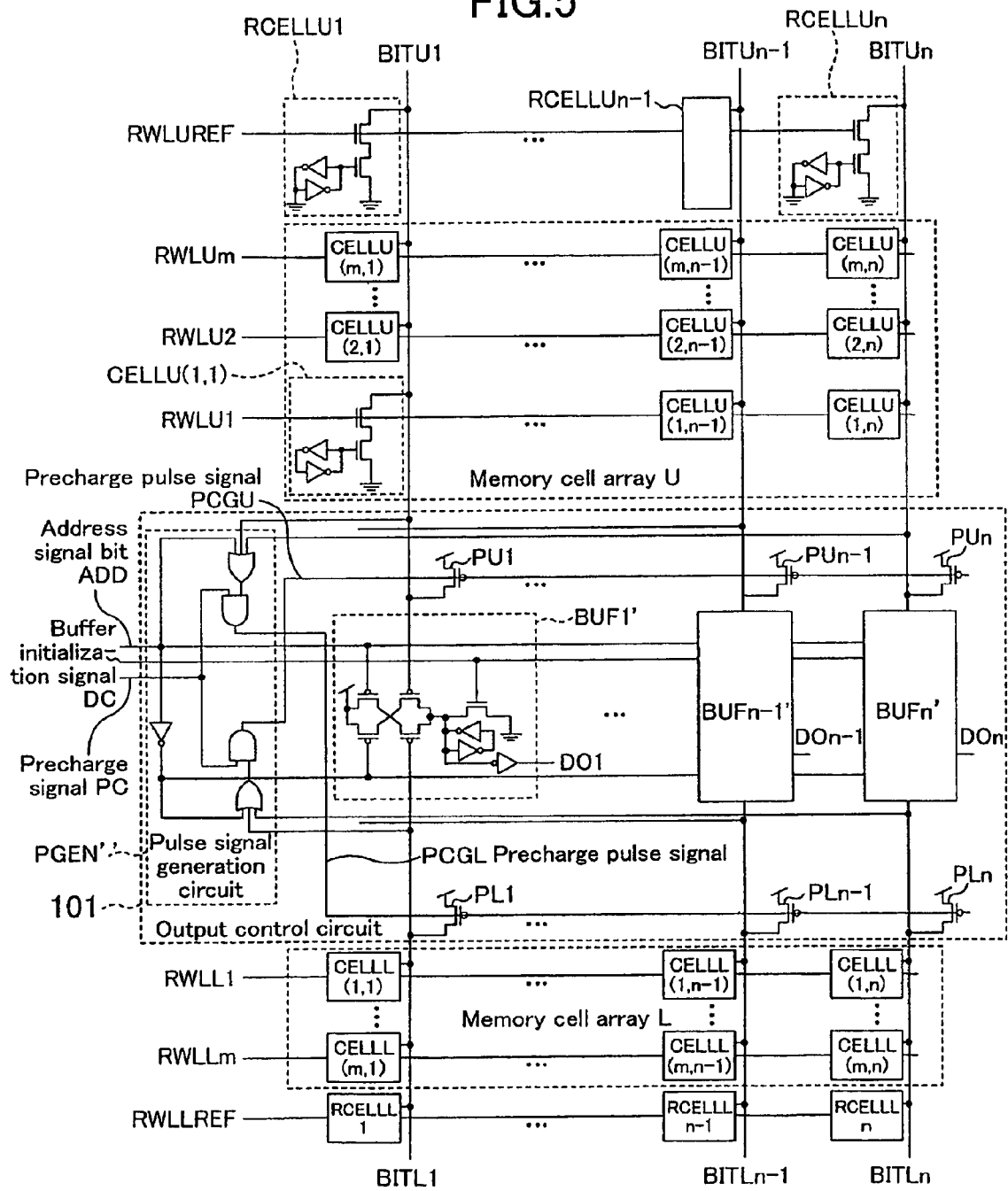
FIG. 5 is a circuit diagram showing a structure of a semiconductor integrated circuit according to embodiment 3.

The semiconductor memory of embodiment 3 is different from the semiconductor memory of embodiment 2 in that the semiconductor memory of embodiment 3 shown in FIG. 5 includes none of the dummy cells DCELLU1 to DCELLUn−1 and DCELLL1 to DCELLLn−1, but all the bit lines BITU1 to BITUn and BITL1 to BITLn are provided with reference cells RCELLU1 to RCELLUn and RCELLL1 to RCELLLn, respectively.

The semiconductor memory of embodiment 3 includes a pulse signal generation circuit PGEN' in place of the pulse signal generation circuit PGEN'. For example, in the case of reading data from the memory cell array U, precharge pulse signal PCGU transitions to H level at the timing when the charges of the bit lines BITL1 to BITLn are discharged so that every bit line potential is decreased to a predetermined level, and accordingly, the reading operation is stopped, and the next precharge operation cycle is started.

Figure 6:
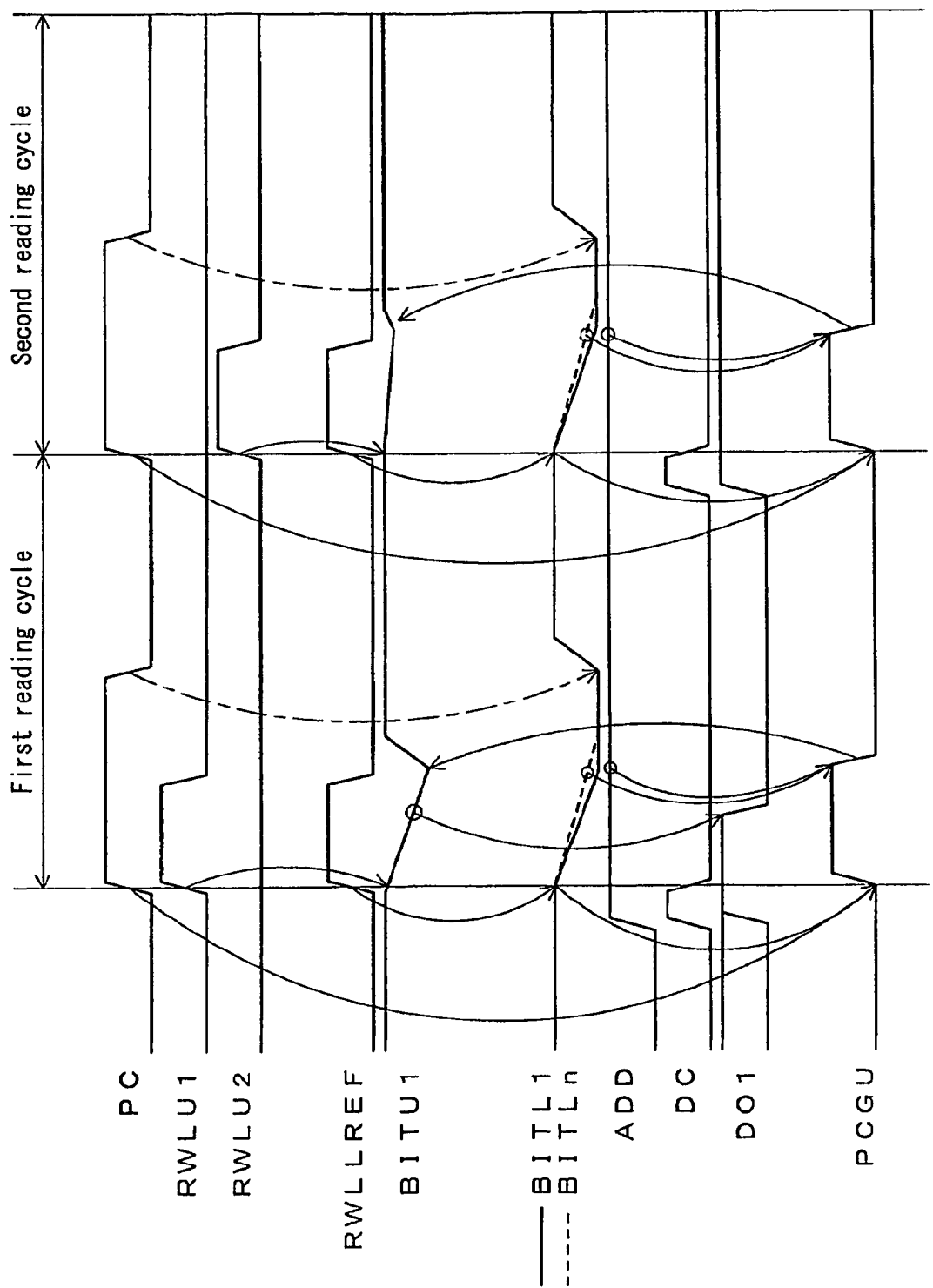
FIG. 6 is a timing chart illustrating a reading operation of the semiconductor integrated circuit according to embodiment 3.
Figure 7:
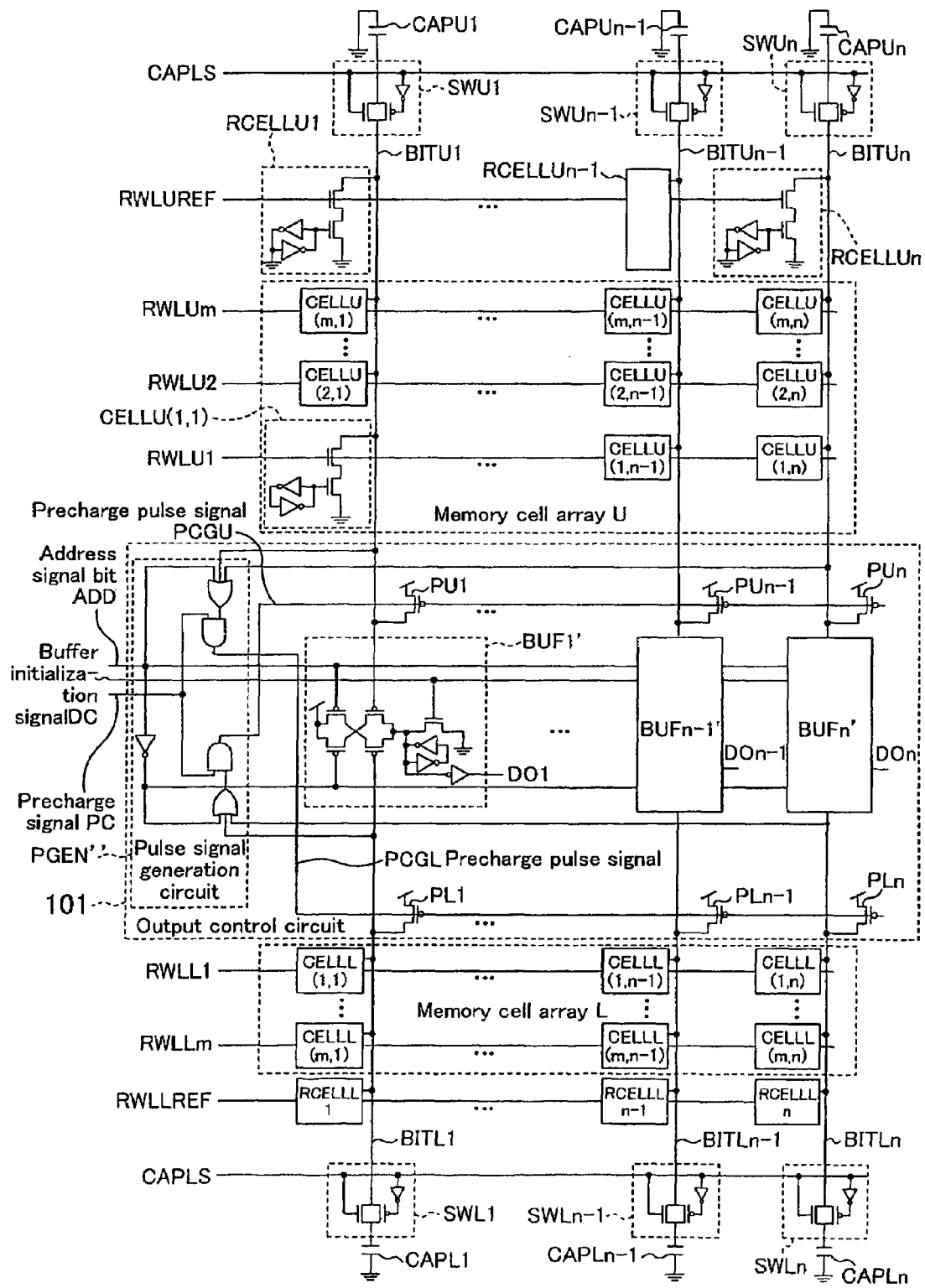
FIG. 7 is a circuit diagram showing a structure of a semiconductor integrated circuit according to embodiment 4.

Hereinafter, a reading operation of embodiment 3 is specifically described with reference to FIG. 6 mainly as to the differences from embodiment 2.

Herein, the reading operation is described based on an example where the memory cell array U is selected and accessed in both the first and second reading cycles. In the first reading cycle, memory data of the memory cells CELLU(1,1) to CELLU(1,n) connected to the word line RWLU1 are read. In the second reading cycle, memory data of the memory cells CELLU(2,1) to CELLU(2,n) connected to the word line RWLU2 are read.

It is assumed herein that the memory data of the memory cell CELLU(1,1) is "0", and the memory data of the memory cell CELLU(2,1) is "1".

(First Reading Cycle)

As in the reading operation of embodiment 2, when precharge signal PC transitions to H level, precharge pulse signals PCGU and PCG1 transition to H level so that the precharge operation is interrupted. At the same time, the word line RWLU1 is pulled to H level so that the bit line BITU1 connected to the memory cell CELLU(1,1) of the memory cell array U is started to be discharged so that the bit line potential quickly decreases and read data signal DO1 transitions to L level.

On the other hand, in the memory cell array L, the reference word line RWLLREF is pulled to H level, so that all the bit lines BITL1 to BITLn of the memory cell array L are started to be discharged by the reference cells RCELLL1 to RCELLLn. If, for example, the current driving capacity of the reference cell RCELLLn is smaller than that of the reference cell RCELLL1, or if the line capacitance of the bit line BITLn is greater than that of the bit line BITL1, the potential of the bit line BITLn decreases moderately as compared with the bit line BIT1 as depicted by a broken line in FIG. 6. In such a case, if the potentials of all the bit lines fall to L level, precharge pulse signal PCGU output from the pulse signal generation circuit PGEN" falls to L level, whereby the precharge operation of the bit lines BITU1 to BITUn of the memory cell array U is started. That is, the reading operation of the memory cell array U is completed at the latest one of the timings when the potentials of the bit lines BITL1 to BITLn of the memory cell array L reach L level.

(Second Reading Cycle)

In the second reading cycle, the memory data of the memory cells CELLU(2,1) to CELLU(2,n) connected to the word line RWLU2 of the memory cell array U are read. To this end, the word line RWLU2 is pulled to H level at the start of the second reading cycle. If the memory data of the memory cell CELLU(2,1) is "1", the potential of the bit line BITU1 decreases only slightly due to leakage so that read data signal DO1 is kept at H level.

Meanwhile, as in the first reading cycle, the reference word line RWLLREF is pulled to H level at the start of the second reading cycle, so that the bit lines BITL1 to BITLn are discharged by the reference cells RCELLL1 to RCELLLn. The reading operation of the memory cell array U is again completed at the latest one of the timings when the potentials of the bit lines BITL1 to BITLn reach L level. Therefore, an error which would be caused by an early start of the precharge operation is prevented.

As described above, the timing of the reading operation is controlled based on the latest discharge timing of the reference cells. Thus, an error which would be caused by the bit line potential decreasing within a short interval due to a leak current can be prevented. Further, even in case of variations in production, an error which would be caused by an early start of the precharge operation before a sufficient decrease of the bit line potential can be more securely prevented.

Embodiment 4

For the purpose of surely making a moderate slope of the decreasing potential of a bit line discharged by a reference cell as compared with a bit line through which data is read, the semiconductor memory may further include, in addition to the components of embodiment 3, capacitances CAPU1 to CAPUn and CAPL1 to CAPLn and switch circuits SWU1 to SWUn and SWL1 to SWLn for connecting the capacitances CAPU1 to CAPUn and CAPL1 to CAPLn, respectively, to the corresponding bit lines according to switch control signals CAPUS and CAPLS.

In an operation of reading memory data, when for example the memory cell array U is accessed, the switch control signal CAPUS is at L level while the switch control signal CAPLS is at H level. On the other hand, when the memory cell array L is accessed, the switch control signal CAPLS is at L level while the switch control signal CAPUS is at H level. With such arrangements, the capacitance of a bit line discharged by a reference cell increases, so that the discharge operation is delayed.

Thus, in an accessed memory cell array, precharging of the bit lines can readily be started at a timing when discharging of the memory cells has been sufficiently done.

It should be noted that the above-described elements of the embodiments and variations thereof may be employed together in various theoretically-possible combinations. Specifically, the output circuits BUF1' to BUFn' of embodiment 2 may be used in embodiment 1 in place of the output circuits BUF1 to BUFn which have the tri-state inverter TINV. On the contrary, the output circuits BUF1 to BUFn of embodiment 1 may be used in any of the other above-described embodiments such that the need for initialization of an internal latch circuit is omitted.

Alternatively, adjustment of the gate width, gate length, threshold voltage, or the like, as described in embodiment 2 may be employed in embodiment 4 wherein the capacitance of the bit lines is selectively increased. On the contrary, the function of selectively increasing the capacitance may be employed in embodiment 2.

Although in embodiment 2 a reference cell is connected to one of bit lines in each memory cell array while in embodiments 3 and 4 every bit line is provided with a reference cell, but the present invention is not limited to these configurations. For example, some bit lines may be provided with reference cells.

Although in each of the above-described embodiments the precharge operation and the reading operation are controlled according to the same precharge pulse signal, but these operations may not be controlled according to the same signal. It is only necessary that the reading operation is completed at least before the start of the precharge operation.

In a semiconductor memory according to the present invention, as described above, the bit line potential is quickly decreased according to memory data, such that a high-speed reading operation is achieved, while an error which would be caused by a decrease of the bit line potential due to a leak current, or the like, is prevented. This effect is readily achieved by the present invention. A semiconductor memory of the present invention is useful as a so-called single bit line semiconductor memory wherein a bit line is precharged to a predetermined potential and then discharged according to memory data, whereby reading of the data is accomplished.

What is claimed is:

1. A semiconductor memory, comprising:
   first and second bit lines;
   a precharge circuit for precharging the first and second bit lines to a predetermined potential;
   a plurality of memory cells each connected to the first or second bit line, a selected one of the memory cells maintaining or discharging one of the precharged first and second bit lines according to a signal held by the selected memory cell;
   word lines for selecting the memory cells;
   first and second reference cells connected to the first and second bit lines, respectively, a selected one of the first and second reference cells discharging the first or second bit line connected to the selected reference cell; and
   first and second reference cell word lines for selecting the first and second reference cells, respectively,
   wherein when one of the memory cells connected to one of the first and second bit lines is selected for reading a signal held in the memory cell, one of the reference cells which is connected to the other bit line is selected.

2. The semiconductor memory of claim 1, wherein, after the precharging of the first and second bit lines is stopped and the memory cell connected to the one of the bit lines is selected while the reference cell connected to the other bit line is selected, when the other bit line is discharged to a predetermined potential, reading of data from the selected memory cell is carried out according to a potential of the one bit line, and precharging of the one bit line is started.

3. The semiconductor memory of claim 2, wherein:
   the first bit line includes a plurality of first bit lines, and the second bit line includes a plurality of second bit lines;
   the first reference cell includes at least one first reference cell connected to one of the first bit lines, and the second reference cell includes at least one second reference cell connected to one of the second bit lines; and
   precharging of the bit lines connected to the selected memory cells (first-group bit lines) is started when one of the other bit lines (second-group bit lines) which is connected to the reference cell is discharged to a predetermined potential.

4. The semiconductor memory of claim 3, wherein:
   the at least one first reference cell includes a plurality of first reference cells connected to the plurality of first bit lines, and the at least one second reference cell includes a plurality of second reference cells connected to the plurality of second bit lines; and when all the second-group bit lines are discharged to a predetermined potential, precharging of the first-group bit lines is started.

5. The semiconductor memory of claim 1, wherein:

each of the memory cell and the reference cell includes a MIS transistor for discharging the first or second bit line; and a gate width of the MIS transistor of the reference cell is smaller than that of the MIS transistor of the memory cell.

6. The semiconductor memory of claim 1, wherein:

each of the memory cell and the reference cell includes a MIS transistor for discharging the first or second bit line; and a gate length of the MIS transistor of the reference cell is greater than that of the MIS transistor of the memory cell.

7. The semiconductor memory of claim 1, wherein:

each of the memory cell and the reference cell includes a MIS transistor for discharging the first or second bit line; and a threshold voltage of the MIS transistor of the reference cell is higher than that of the MIS transistor of the memory cell.

8. The semiconductor memory of claim 1, wherein:

each of the memory cell and the reference cell includes a MIS transistor for discharging the first or second bit line; and a substrate potential of the MIS transistor of the reference cell and a substrate potential of the MIS transistor of the memory cell are set such that a discharge current of the reference cell is smaller than that of the memory cell.

9. The semiconductor memory of claim 1, wherein:

each of the memory cell and the reference cell includes a switching element for discharging the first or second bit line; and at the start of the discharging of the bit line, a difference in potential between both ends of the switching element of the reference cell is smaller than a difference in potential between both ends of the switching element of the memory cell.

10. The semiconductor memory of claim 1, wherein:

each of the memory cell and the reference cell includes a switching element for discharging the first or second bit line and a control circuit for controlling the switching element; and a supply voltage supplied to the control circuit of the reference cell is lower than a supply voltage supplied to the control circuit of the memory cell.

11. The semiconductor memory of claim 1, wherein each of the first and second bit lines is connected to a capacitive element through a switching element.

12. The semiconductor memory of claim 1, further comprising a buffer for reading data, the buffer being connected to the first and second bit lines, wherein the reference cell is more distant from the buffer than the memory cell is.

* * * * *